United States Patent [19]

Yoder

[11] 3,725,803

[45] Apr. 3, 1973

[54] HYBRID ELECTRON-BEAM, SEMICONDUCTOR-DIODE AMPLIFYING DEVICE

[76] Inventor: Max N. Yoder, 6512 Truman Lane, Falls Church, Va. 22043

[22] Filed: Jan. 25, 1972

[21] Appl. No.: 220,672

[52] U.S. Cl. ....................330/46, 313/65 AB, 315/3, 330/15

[51] Int. Cl. ....................H03f 3/04

[58] Field of Search ................315/3; 330/44, 45, 46; 313/65 A, 65 AB, 66; 307/308

[56] References Cited

UNITED STATES PATENTS

| | | | |
|---|---|---|---|
| 2,981,891 | 4/1961 | Horton | 315/3 |
| 3,020,438 | 2/1962 | Sziklai | 315/3 |
| 3,459,985 | 8/1969 | Ake et al. | 313/65 AB |
| 3,676,716 | 7/1972 | Hanrahan | 313/65 A |

*Primary Examiner*—John Kominski
*Attorney*—R. S. Sciascia et al.

[57] ABSTRACT

A hybrid amplifying device comprising an electron-beam-forming device and a pair of P-N semiconductor junction devices. The junction devices are connected in a pushpull circuit arrangement with respect to a load. They are also arranged so that they are separated by the beam width. The beam is deflected by an input signal so that with increasing deflection in one direction or another, it will irradiate increasing areas of one junction device or the other, respectively. The current flow is a direct function of the amount of area irradiated by the beam and the amplification is therefore linear.

2 Claims, 4 Drawing Figures

HYBRID ELECTRON-BEAM, SEMICONDUCTOR-DIODE AMPLIFYING DEVICE

BACKGROUND OF THE INVENTION

This invention relates to amplifiers and especially to hybrid amplifiers in which an electron beam is deflected across P-N semiconductor diode junctions.

All currently known electronic amplifiers tend to suffer gain compression when driven near or above design input levels, the compression resulting in adverse non-linear operation. To a lesser extent, these adverse effects are also present at moderate drive levels. Nonlinearily of amplifier response is the major cause of spurious signals known as intramodulation and cross modulation products. These are particularly difficult problems in wideband communications systems and in any amplifier which simultaneously handles more than one signal.

BRIEF SUMMARY OF THE INVENTION

The objects and advantages of the invention are accomplished by deflecting an electron beam by an amount which is proportionate to the signal which is to be amplified. The beam falls between a pair of P-N junction diodes when it is in its undeflected position and traverses one or the other diode when deflected, the diodes being connected in a push-pull arrangement. The extent of the area of each diode irradiated by the beam is a direct function of the amplitude of the deflecting signal and therefore the amount of current flowing through the diode is a linear function of the deflecting signal.

OBJECTS OF THE INVENTION

An object of this invention is to amplify an AC signal without distortion.

A further object is to provide a hybrid amplifier utilizing a deflection-modulated electron beam to irradiate a pair of P-N junction devices for linear amplification of the deflection signal.

Other objects, advantages and novel features of the invention will become apparent from the following detailed description of the invention when considered in conjunction with the accompanying drawings wherein:

DETAILED DESCRIPTION OF THE INVENTION

Figures 1, 3:
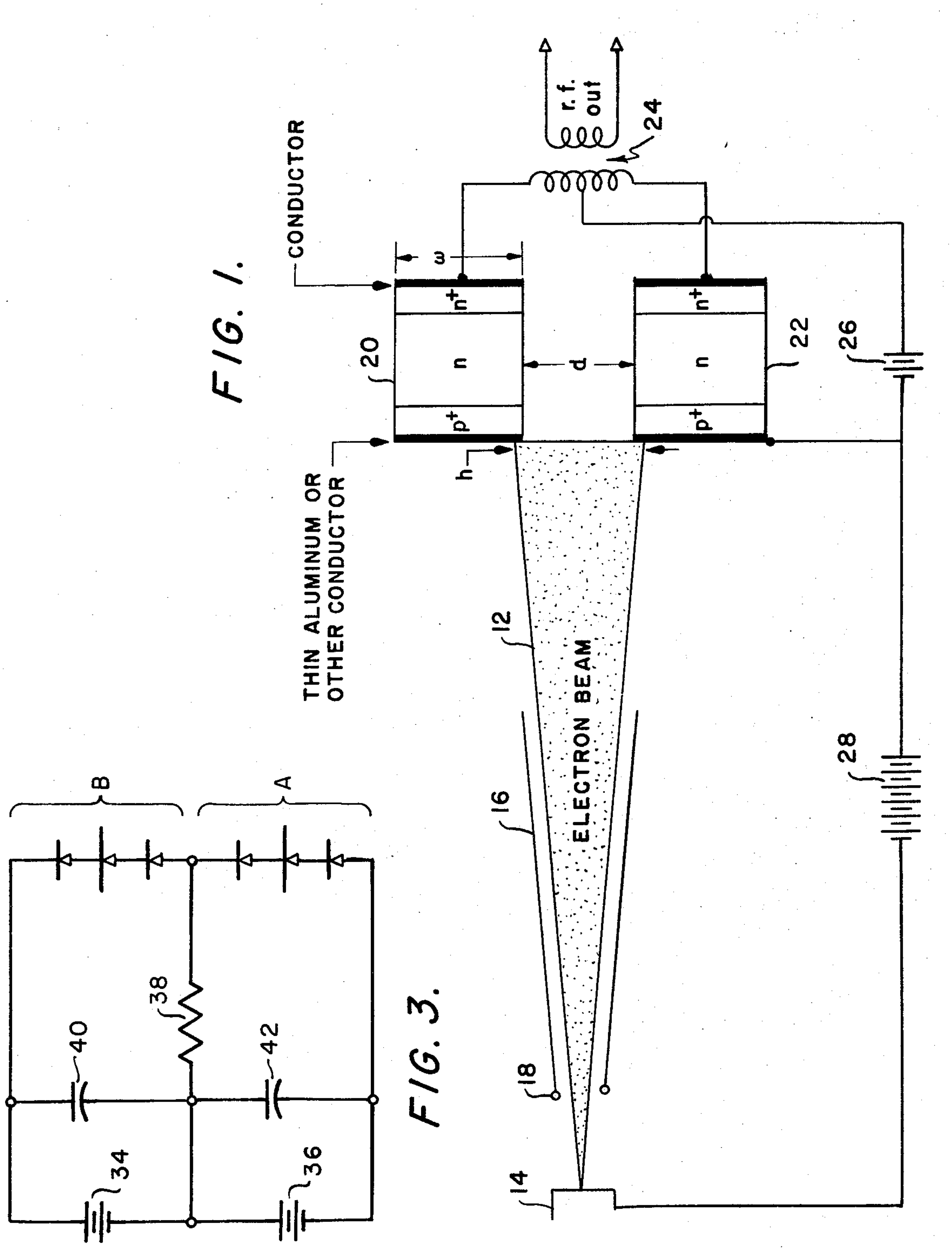
FIG. 1 is a schematic illustration of a first embodiment of the invention.
FIG. 3 is a schematic illustration of a method of increasing the output impedance of the amplifier.

FIG. 1 illustrates that irradiation of a pair of spaced P-N semiconductor junction diodes by an electron beam. The electron-beam 12 is emitted by the cathode 14 of an electron gun having travelling-wave deflection plates 16. The beam velocity is adjusted so that it is equal to the input signal propagation velocity along the deflection plates 16. The input signal, e.g., a sinusoidal wave which is to be amplified, is applied at the cathode end 18 of the deflection plate 16.

A pair of large P-N semiconductor junction diodes 20 and 22 are located at the target end of the electron beam 12. The P-region of the diodes is nearest the beam 12 and is surfaced with a thin film of conducting material, such as aluminum. In each diode, the P-region is heavily doped with impurity material and is separated from a narrow, heavily doped, N-region by a less highly doped, wider N-region. The primary of an output transformer 24 can be hooked across the $N^+$ region of the two diodes and a bias source 26 can be applied across the diodes with the positive side of the source being coupled to the $N^+$ regions through the midpoint of the output transformer 24.

The target diodes 20 and 22 are separated by a transverse distance ($d$) equal to or slightly less than the width ($h$) of the electron beam which is slightly less or equal to the width ($w$) of the active region of each diode. Thus, $d \leq h \leq w$. If the beam width is greater than the width of the diodes ($h>w$), the efficiency is reduced. If $h<w$, nonlinear operation on signal peaks results.

Application of a small AC signal to the deflection plates 16 causes a proportionately small portion of the electron beam to impinge alternately on a proportionately small area of the diodes. A proportionately small amplified signal output is obtained. Application of a larger AC input signal to the deflection plates causes a proportionately larger beam deflection and a proportionately larger area of each diode to be irradiated. The amount of current through each diode is a function of the area of the diode which is irradiated.

The amplitude of the input signal can be increased with proportionately increased output signals until the electron-beam is deflected to the point at which the entire active width of each diode is covered.

The linearily of this device results from the fact that the amount of amplification is a linear function of the amount of area in each diode that is irradiated by the electron-beam, assuming that the distribution of electrons in the beam is spatially uniform and that the charge density in each diode remains constant regardless of the extent of the area that is irradiated. The distribution of electrons in the electron-beam can be kept spatially uniform by the use of a laminar-flow pierced gun, for example. The charge density is constant because it depends on the accelerating potential 28 of the electron-beam 12 and the impact ionization constant of the semiconductor material. Both of these are constant.

Since the charge density in the diodes is constant, the base-widening effect which occurs in semiconductor diodes and transistors does not occur and this eliminates change of capacity of the diodes with changing signal amplitude.

The device operates in the class AB mode if the width of the electron-beam is slightly larger than the diode spacing ($h>d$) and in the class B mode if the two are equal ($h=d$).

An advantage of the device is that it can be made more efficient than transistor amplifiers in general. The impurity doping concentration in the diode depletion region can be chosen optimally so as to correspond to the constant charge density within the device as opposed to the compromise doping levels in transistors wherein the charge density is continually varying as a function of the instantaneous signal level. Also, because the charge density is constant, the analogous situation of "base widening" and consequent changing of base-to-collector, or output capacitance with instantaneous signal level is eliminated, thereby eliminating the distortion and nonlinear operation so engendered.

Another advantage is the following: In a power transistor, thermal runaway and secondary voltage breakdown are prevalent catastrophic failure mechanisms caused by non-uniform temperatures and resulting non-uniform current density (current hogging) across the cross-sectional area. For the device shown in FIG. 1, the internal diode current density is a function only of the electron-beam current density. Thus, if a minute area of the diode is less adequately beat-sinked than other regions, there is no emitter to get hotter in that area and inject proportionately greater charge densities with proportionately greater induced heat and resultant thermal runaway or secondary voltage breakdown. The positive feedback mechanism between heat concentration and charge-carrier injection is eliminated. A much more reliable device results.

Figures 2, 4:
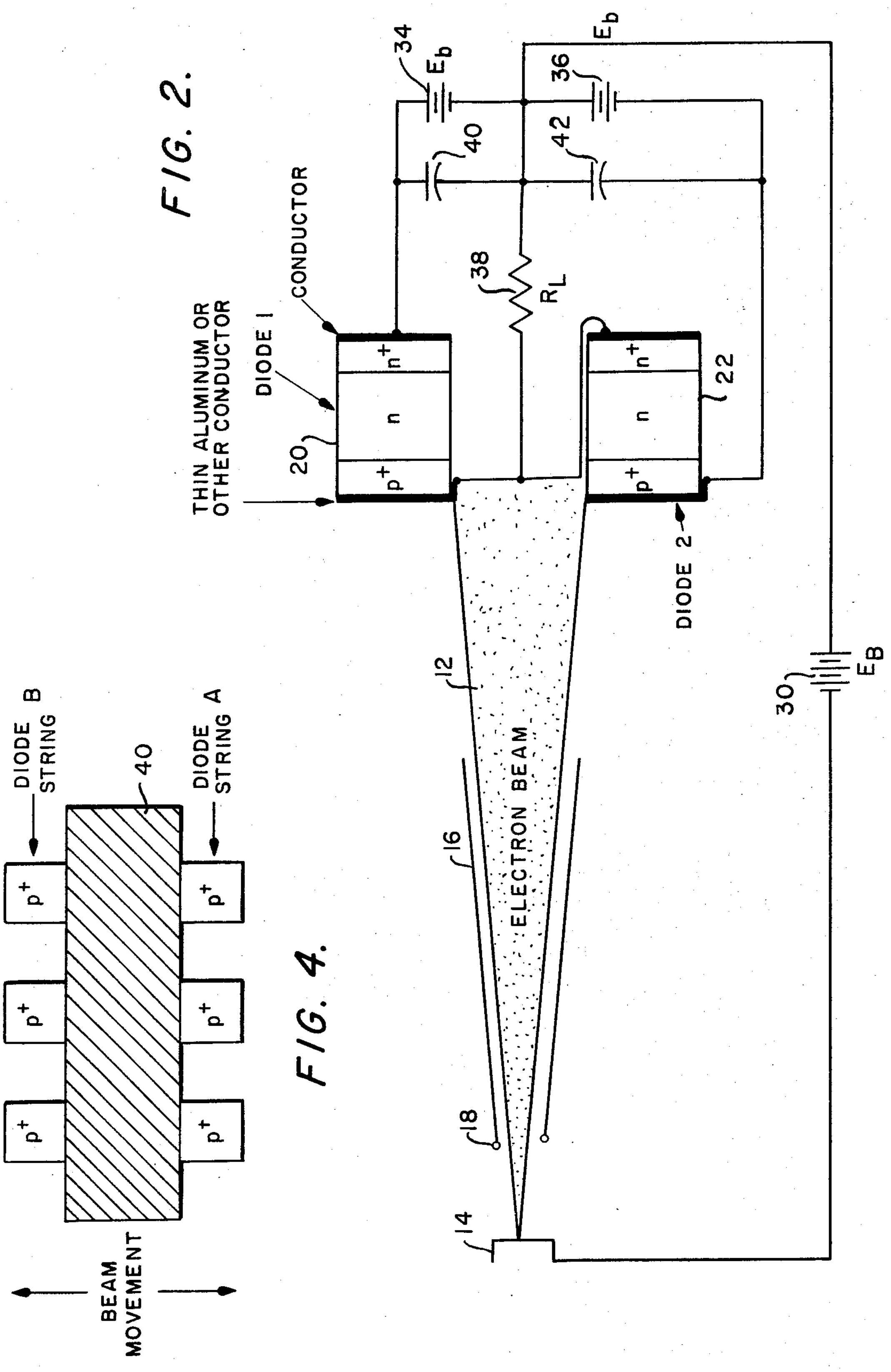
FIG. 2 is a schematic illustration of a second embodiment of the invention.
FIG. 4 is a schematic illustration of the physical arrangement of the diodes and the *e*-beam of the embodiment shown in FIG. 3.

Another embodiment which retains the aforementioned advantages and operates efficiently as a class B is shown schematically in FIG. 2. This embodiment has two power supplies, 34 and 36, for the diodes. There are connected in series (with a capacitor 40 and 42 across each one) from the $N^+$ region of diode 20 to the $P^+$ region of diode 22, the positive terminal of the source 34 being connected to the $N^+$ region of diode 20. The $P^+$ region of diode 20 is connected directly to the $N^+$ region of diode 22. A resistive load 38 is connected between the midpoints of the power supplies and the capacitors and the $P^+$ region of the diode 20 (or the $N^+$ region of the diode 22).

The electron-beam 12 in the quiescent, no-sigual, state impinges between the diodes 20 and 22. A N input signal causes beam deflection and amplification as before. Should a positive transient reflect from the load 38 into the amplifier, the diode 20 goes into forward conduction and clamps the transcent to a peak potential no greater than that of the power supply 34. Thus, reflected positive voltage may never reach a magnitude sufficient to cause reverse bias breakdown of the diode 22. A negative transient signal is simularly clamped by the diode 22 to prevent excessive reverse bias breakdown of the diode 20. Thus, the circuit protects itself against catastrophic failure resulting from reflected transcent energy.

FIG. 3 illustrates a method of increasing the output impedance of the amplifier by placing several diodes in series. Each string (A or B) must have each diode therein equatly and simultaneously bombarded by electrons. If there are N diodes per string whose total active area is equal to that of the one large diode they replace, then the output impedance is N times greater than that of the single-diode configuration. The output powers are equal, the output current (and current in each diode) is $1/\sqrt{n}$ times that of the single-diode configuration, and the electron-beam current is $\sqrt{n}$ times larger. As a result of the latter, amplifier gain is reduced by $\sqrt{n}$.

FIG. 4 illustrates schematically how the diode strings and electron-beam are arranged. The electron-beam-gain cathode can be visualized as being in front of the drawing, the beam going into the paper. The beam cross-section 40 is shown in the quiescent position of the beam. The $P^+$ regions of all diodes face the beam. Note that the $P^+$ region of each diode in a give string is connected to the $N^+$ region of the next diode not to its $P^+$ region, as it would seem from FIG. 4. The connections are as shown in FIG. 3.

Obviously many modifications and variations of the present invention are possible in the light of the above teachings. It is therefore to be understood that within the scope of the appended claims the invention may be practiced otherwise than as specifically described.

What is claimed and desired to be secured by Letters Patent of the United States is:

1. A hybrid amplifying device comprising, in combination:
   - electron-beam-generating means;
   - at least two P-N semiconductor junction diode devices spaced from each other by an amount $d$, the active region of each diode being of width $w$;
   - power supply means and load means connected to said junction devices and said electron-beam means;
   - said diodes and load means being arranged in a push-pull configuration,
   - said junction device further being arranged so that the p material faces the electron-beam for irradiation, said electron-beam having a cross-sectional width, $h$, at the point at which it impinges on said junction devices, a constraint condition of the amplifying device being that $d \leq h \leq w$,
   - said electron-beam, in its quiescent state, falling between said junction devices and being deflectable to irradiate one or the other of said junction devices alternatively in accordance with an input signal applied to the beam-deflection plates of said electron-beam means,
   - said electron-beam being arranged to have uniform spatial density and the charge-current density in each junction device being kept constant under all conditions of operation.

2. A device as set forth in claim 1, wherein said device includes at least four P-N junction devices arranged in two groups in each of which the P-N junction devices are connected in series, the groups being connected in push-pull circuit arrangement, the physical arrangement of the electron-beam and the diodes being such that the electron-beam strikes each of the diodes in a given group simultaneously and equally in areal coverage.

* * * * *